United States Patent
Wrench et al.

(10) Patent No.: US 11,421,318 B2
(45) Date of Patent: Aug. 23, 2022

(54) METHODS AND APPARATUS FOR HIGH REFLECTIVITY ALUMINUM LAYERS

(71) Applicant: APPLIED MATERIALS, INC., Santa Clara, CA (US)

(72) Inventors: Jacqueline Wrench, San Jose, CA (US); Liqi Wu, Santa Clara, CA (US); Hsiang Ning Wu, Sunnyvale, CA (US); Paul Ma, Santa Clara, CA (US); Sang-Ho Yu, Cupertino, CA (US); Fuqun Grace Vasiknanonte, Sunnyvale, CA (US); Nobuyuki Sasaki, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/398,782

(22) Filed: Apr. 30, 2019

(65) Prior Publication Data
US 2019/0338415 A1 Nov. 7, 2019

Related U.S. Application Data

(60) Provisional application No. 62/667,086, filed on May 4, 2018.

(51) Int. Cl.
*C23C 16/12* (2006.01)
*H01L 21/02* (2006.01)

(52) U.S. Cl.
CPC .......... *C23C 16/12* (2013.01); *H01L 21/0254* (2013.01); *H01L 21/0262* (2013.01);
(Continued)

(58) Field of Classification Search
CPC ............... C23C 16/12; H01L 21/02186; H01L 22/02271; H01L 21/0254; H01L 21/0262; H01L 21/02658
See application file for complete search history.

(56) References Cited

U.S. PATENT DOCUMENTS 3,498,818 A * 3/1970 Bahm .................... C23C 14/18
427/250
4,483,750 A * 11/1984 Powers .................. C25D 11/08
205/213
(Continued)

FOREIGN PATENT DOCUMENTS

EP         0156591    *  8/1985   ............. C25D 11/08
JP      09-115908 A       5/1997
(Continued)

OTHER PUBLICATIONS

Arif, Muhammad, et al., "Characterization of aluminum and titanium nitride films prepared by reactive sputtering under different poisoning conditions of target". J. Vac. Sci. Technol. A 35, 061507 (2017) pp. 1-10. https://doi.org/10.1116/1.4993082.*

(Continued)

*Primary Examiner* — Bret P Chen
(74) *Attorney, Agent, or Firm* — Moser Taboada

(57) ABSTRACT

Methods and apparatus for increasing reflectivity of an aluminum layer on a substrate. In some embodiments, a method of depositing an aluminum layer on a substrate comprises depositing a layer of cobalt or cobalt alloy or a layer of titanium or titanium alloy on the substrate with a chemical vapor deposition (CVD) process, pre-treating the layer of cobalt or cobalt alloy with a thermal hydrogen anneal at a temperature of approximately 400 degrees Celsius if a top surface of the layer of cobalt or cobalt alloy is compromised, and depositing a layer of aluminum on the layer of cobalt or cobalt alloy or the layer of titanium or titanium alloy with a CVD process at a temperature of approximately 120 degrees Celsius. Pre-treatment of the layer of cobalt or cobalt alloy may be accomplished for a duration of approximately 60 seconds to approximately 120 seconds.

15 Claims, 4 Drawing Sheets

(52) U.S. Cl.
CPC .. *H01L 21/02186* (2013.01); *H01L 21/02271* (2013.01); *H01L 21/02658* (2013.01)

(56) References Cited

U.S. PATENT DOCUMENTS

| | | | | |
|---|---|---|---|---|
| 4,808,471 | A | * | 2/1989 | Grunzinger ........ C08G 18/6229 428/325 |
| 4,820,611 | A | * | 4/1989 | Arnold, III ............. G03F 7/091 430/271.1 |
| 5,047,367 | A | | 9/1991 | Wei et al. |
| 5,759,916 | A | * | 6/1998 | Hsu ..................... H01L 21/0276 257/E21.029 |
| 5,861,189 | A | | 1/1999 | Sheel et al. |
| 5,904,969 | A | * | 5/1999 | Kamezaki .......... G11B 7/24076 428/64.1 |
| 6,017,144 | A | | 1/2000 | Guo et al. |
| 6,120,844 | A | | 9/2000 | Chen et al. |
| 6,383,915 | B1 | | 5/2002 | Su et al. |
| 8,927,059 | B2 | | 1/2015 | Lu et al. |
| 2001/0047932 | A1 | * | 12/2001 | Yu .................... H01L 21/76882 204/192.12 |
| 2002/0190643 | A1 | * | 12/2002 | Cummings .......... C09K 11/642 313/553 |
| 2004/0150864 | A1 | * | 8/2004 | Blech ................ G02B 26/0808 359/247 |
| 2005/0150865 | A1 | * | 7/2005 | Fujinawa ................ C03C 17/42 216/44 |
| 2006/0076680 | A1 | * | 4/2006 | Williams .......... H01L 21/76877 257/757 |
| 2007/0037414 | A1 | * | 2/2007 | Yamauchi ............... G11C 23/00 438/800 |
| 2007/0275489 | A1 | | 11/2007 | Zhou |
| 2009/0016407 | A1 | * | 1/2009 | Mizuno .................... G01K 3/14 374/161 |
| 2009/0087983 | A1 | | 4/2009 | Lee et al. |
| 2009/0134419 | A1 | | 5/2009 | Zhou |
| 2010/0290021 | A1 | * | 11/2010 | Pazidis ................ G02B 5/0833 355/67 |
| 2011/0127549 | A1 | * | 6/2011 | Lee .......................... H01L 33/46 257/88 |
| 2012/0258561 | A1 | * | 10/2012 | Li .......................... H01L 31/056 438/96 |
| 2013/0020719 | A1 | * | 1/2013 | Jung .................... H01L 25/0657 257/774 |
| 2015/0004314 | A1 | * | 1/2015 | Winter ...................... C01G 3/05 427/252 |
| 2015/0093891 | A1 | | 4/2015 | Zope et al. |
| 2015/0129913 | A1 | * | 5/2015 | Chang .................... H01M 4/463 257/98 |
| 2015/0262823 | A1 | * | 9/2015 | Hung ................ H01L 21/28088 257/368 |
| 2015/0299848 | A1 | * | 10/2015 | Haukka ................... C23C 16/02 427/123 |
| 2016/0079061 | A1 | | 3/2016 | Tanigawa |
| 2017/0031067 | A1 | * | 2/2017 | Quijada ............... G02B 5/0891 |
| 2018/0068889 | A1 | | 3/2018 | Choi et al. |
| 2018/0211872 | A1 | * | 7/2018 | Wu ................... H01L 21/76864 |

FOREIGN PATENT DOCUMENTS

| | | | | |
|---|---|---|---|---|
| JP | 2015018839 | A | 1/2015 | |
| KR | 2002-0048716 | * | 6/2002 | .......... H01L 27/146 |
| WO | WO 2007/136186 | A1 | 11/2007 | |
| WO | WO 2014/130506 | A1 * | 8/2014 | .............. G02B 5/08 |
| WO | WO 2017/032807 | A3 * | 3/2017 | .............. G02B 5/08 |

OTHER PUBLICATIONS

Arias, Nathaly, et al., "Highly reflective aluminum films on polycarbonate substrates by physical vapor deposition". Applied Surface Science, 505 (2020) 144596, pp. 1-7.*

Glenn, Jason, et al., "Low-volume aluminum and aluminum / titanium nitride bilayer lumped-element kinetic inductance detectors for far-infrared astronomy". Proc. SPIE 9914, Millimeter, Submillimeter, and Far-Infrared Detectors and Instrumentation for Astronomy VIII, 99140Z (Jul. 19, 2016), pp. 1-8, doi: 10.1117/12.*

Blech, I. et al., "Electromigration in thin aluminum films on titanium nitride". Journal of Applied Physics 47, 1203 (1976). https://doi.org/10.1063/1.322842 Abstract Only.*

Lugolole, Robert, et al., "The Effect of Thickness of Aluminium Films on Optical Reflectance". Journal of Ceramics vol. 2015, Article ID 213635, 6 pages, http://dx.doi.org/10.1155/2015/213635.*

Yang, Minghong, et al., "Highly reflecting aluminum-protected optical coatings for the vacuum-ultraviolet spectral range". Applied Optics, vol. 45, No. 1, Jan. 1, 2006, pp. 178-183.*

Weidner, Victor R., et al., "Preparation and Calibration of First-Surface Aluminum Mirror Specular Reflectance Standards". National Bureau of Standards Special Publication 260-75, 26 pages (May 1982).*

Janecek, Martin, "Reflectivity Spectra for Commonly Used Reflectors". 2012, pp. 1-9. Citation information unavailable.*

Lugole, Robert, et al., "The Effect of Thickness of Aluminum Films on Optical Reflectance". Journal of Ceramics, Hindawi Publishing Company, vol. 2015, Article ID 213635, pp. 1-6.*

Prasad, Komai, et al., "Highly Reflective Coatings". International Journal of Applied Engineering Research ISSN 0973-4562 vol. 13, No. 22 (2018) pp. 15773-15782.*

Huang, Bohr-Ran, et al., "Effects of pretreatment and post-annealing on the field emission property of diamond-like carbon grown on a titanium/silicon substrate". New Carbon Materials, vol. 23, Issue 3, Mar. 2008, pp. 209-215.*

International Search Report for PCT/US2019/030307, dated Aug. 16, 2019.

Statistical Qualitative Analysis on Chemical Mechanical Polishing Process and Equipment Characterization, San Jeen Hong, Jong Ha Hwang, and Dong-Sun Seo, Department of Electronic Engineering, Myongji University, Yongin 449-728, Korea, Feb. 1, 2011; Transactions On Electrical and Electronic Materials vol. 12, No. 2, pp. 56-59, Apr. 25, 2011.

Put the Pieces Together in the Materials Space: Advanced Materials Solutions for 10nm and Beyond, Dr. Spencer Tu, Director, Taiwan Technology Center.

Reflectance in Thin Films, Materion Microelectronics & Services.

* cited by examiner

METHODS AND APPARATUS FOR HIGH REFLECTIVITY ALUMINUM LAYERS

CROSS-REFERENCE TO RELATED APPLICATIONS

This application claims benefit of U.S. provisional patent application Ser. No. 62/667,086, filed May 4, 2018 which is herein incorporated by reference in its entirety.

FIELD

Embodiments of the present principles generally relate to semiconductor processing.

BACKGROUND

Semiconductors are formed in one or more process chambers which have the capability to process substrates (e.g., semiconductor wafers) in a controlled processing environment. Some of the process chambers are used to deposit materials onto a substrate such as, for example, aluminum. Due to the conductive and reflective properties of aluminum, aluminum has been incorporated into many different elements of semiconductor designs. Image sensors often use aluminum to provide reflective properties necessary for a sensor's operation. The semiconductor processes typically deposit an aluminum layer on a substrate made of silicon, usually on a titanium nitride (TiN) layer deposited on the substrate. However, the inventors have observed that the reflectivity of the aluminum when deposited on TiN has been generally poor at less than 50% reflectivity across a wide band of wavelengths. The poor reflectivity adversely affects the performance of the image sensors.

Thus, the inventors have provided improved methods and apparatus for deposition of an aluminum layer with high reflectivity.

SUMMARY

Methods and apparatus provide increased aluminum reflectivity for semiconductor processes.

In some embodiments, a method of depositing an aluminum layer on a substrate comprises depositing a layer of cobalt or cobalt alloy or a layer of titanium or titanium alloy on the substrate and depositing a layer of aluminum on the layer of cobalt or cobalt alloy or the layer of titanium or titanium alloy.

In some embodiments, the method may further include pre-treating the layer of cobalt or cobalt alloy with a thermal hydrogen anneal before depositing the layer of aluminum; pre-treating the layer of cobalt or cobalt alloy at a temperature of approximately 300 degrees Celsius to approximately 400 degrees Celsius; pre-treating the layer of cobalt or cobalt alloy for a duration of approximately 60 seconds to approximately 120 seconds; wherein the layer of aluminum has a reflectivity of at least approximately 80% for wavelengths between approximately 250 nm and approximately 900 nm; depositing the layer of cobalt or cobalt alloy or the layer of titanium or titanium alloy to a thickness of approximately 20 angstroms to approximately 30 angstroms; depositing the layer of cobalt or cobalt alloy or the layer of titanium or titanium alloy with a chemical vapor deposition (CVD) process, a metal-organic chemical vapor deposition (MOCVD) process or a physical vapor deposition (PVD) process; wherein the layer of cobalt or cobalt alloy includes cobalt or cobalt silicon and wherein the layer of titanium or titanium alloy includes titanium, titanium silicon, or titanium aluminum; depositing the layer of aluminum to a thickness of approximately 300 angstroms to approximately 1,000 angstroms; depositing the layer of aluminum at a temperature of approximately 60 degrees Celsius to approximately 250 degrees Celsius; depositing the layer of aluminum using a hydrogen gas, an ammonia gas, a hydrazine compound gas, a hydrogen and ammonia mixed gas, or a hydrogen and hydrazine compound gas as a reactant gas; depositing the layer of aluminum using an alane type precursor or an alkyl type precursor; wherein the alane type precursor includes trimethylamine-alane borane (TMAAB), methyl pyridine aluminum, or dimethylethylamine-alane; wherein the alkyl type precursor includes dimethylaluminum hydride (DMAH); and/or depositing the layer of cobalt or cobalt alloy or the layer of titanium or titanium alloy on a layer of titanium nitride deposited on the substrate.

In some embodiments, a method of depositing an aluminum layer on a substrate comprises depositing a layer of cobalt or cobalt alloy or a layer of titanium or titanium alloy on the substrate with a chemical vapor deposition (CVD) process to a thickness of approximately 20 angstroms to approximately 30 angstroms, pre-treating the layer of cobalt or cobalt alloy with a thermal hydrogen anneal at a temperature of approximately 400 degrees Celsius if a top surface of the layer of cobalt or cobalt alloy is compromised, and depositing a layer of aluminum on the layer of cobalt or cobalt alloy or the layer of titanium or titanium alloy with a CVD process at a temperature of approximately 120 degrees Celsius and to a thickness of approximately 300 angstroms to approximately 1,000 angstroms.

In some embodiments, the method further comprises pre-treating the layer of cobalt or cobalt alloy for a duration of approximately 60 seconds to approximately 120 seconds; depositing the layer of cobalt or cobalt alloy or the layer of titanium or titanium alloy on a layer of titanium nitride deposited on the substrate; and/or wherein the layer of aluminum has a reflectivity of at least approximately 80% for wavelengths between approximately 250 nm and approximately 900 nm.

In some embodiments, an apparatus for reflecting varying wavelengths in a semiconductor device comprises a substrate formed from a silicon-based material, a titanium nitride layer deposited on the silicon-based material of the substrate, a cobalt or cobalt alloy layer or a titanium or titanium alloy layer deposited on the titanium nitride layer, and an aluminum layer deposited on the cobalt or cobalt alloy layer or a titanium or titanium alloy layer.

In some embodiments, the apparatus may further include a high aspect ratio feature having an opening with sides and a bottom formed in the substrate, wherein the aluminum layer is conformal to the sides and the bottom of the high aspect ratio feature and/or wherein the aluminum layer has a reflectivity of at least 80%.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
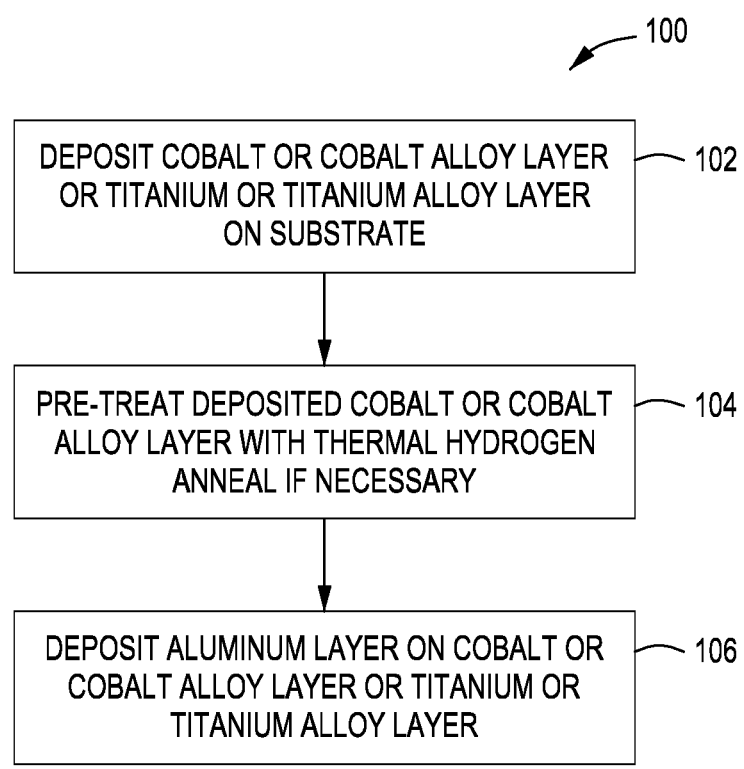
FIG. 1 is a method of forming high reflectivity aluminum layers in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a high reflectivity aluminum layer on a semiconductor substrate. A cobalt or cobalt alloy underlayer or titanium or titanium alloy underlayer advantageously increases the smoothness of the aluminum layer which, in turn, increases the reflectivity over a wide band of wavelengths. The methods and apparatus also provide a highly conformal aluminum layer while maintaining the increased reflectivity. The high reflectivity is also beneficially maintained after subsequent semiconductor processes that require thermal processing.

The inventors have found that using underlayers such as tungsten (W), Ruthenium (Ru), or titanium nitride (TiN) yield reflectivity numbers of less than 50% across a wide band of wavelengths. The tungsten, Ru, and TiN do not provide a good underlayer for aluminum deposition, causing poor reflectivity. The inventors have discovered that underlayers of cobalt or cobalt alloy or titanium or titanium alloy provide a much higher reflectivity (e.g., approximately 85% across the band of wavelengths) and greater deposition rates for aluminum layers. The inventors have also found that lowering the deposition temperature of the aluminum layer yields a higher reflectivity for the aluminum layer and provides better step coverage and gap fill. The methods and apparatus of the present principles provide improved nucleation of the aluminum deposition on a cobalt or cobalt alloy or titanium or titanium alloy underlayer due to agglomeration at the substrate interface, yielding smoother and more continuous aluminum films and increased reflectivity.

Figure 2:
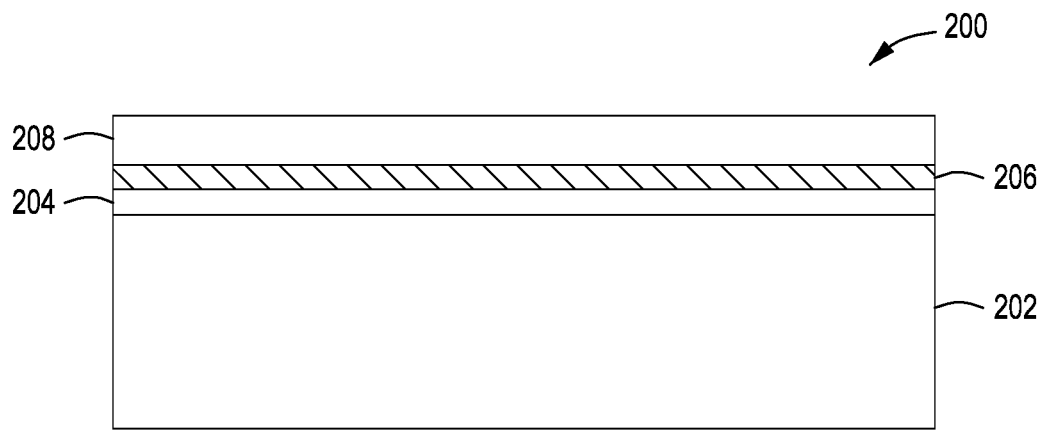
FIG. 2 depicts a cross-sectional view of a structure formed from the method of FIG. 1 in accordance with some embodiments of the present principles.

FIG. 1 is a method 100 of forming high reflectivity aluminum layers in accordance with some embodiments. At block 102, the method begins by depositing a cobalt or cobalt alloy layer or titanium or titanium alloy layer 208 on a substrate 202 as illustrated in FIG. 2 which depicts a cross-sectional view of a structure 200 formed from the method of FIG. 1. In some embodiments, a cobalt or cobalt alloy layer may include cobalt or a cobalt alloy such as, but not limited to, cobalt silicon (CoSi) and the like. In some embodiments, a titanium or titanium alloy layer may include titanium or a titanium alloy such as, but not limited to, titanium aluminum (TiAl), titanium silicon (TiSi), and the like. In some embodiments, the TiAl layer may be deposited using $TiCl_4$ (titanium tetrachloride)+TEA (triethylaluminium). The aluminum and/or chloride concentration may vary between approximately 10% to approximately 40% depending on process conditions and/or applications. In some embodiments, the substrate 202 may be formed from a silicon-based material and may have a layer of silicon oxide layer 204 on an upper surface of the substrate 202. In some embodiments, the substrate 202 may also have a titanium nitride (TiN) layer 206 deposited on the substrate 202 prior to the deposition of the cobalt or cobalt alloy layer or titanium or titanium alloy layer 208. In some embodiments, the cobalt or cobalt alloy layer or titanium or titanium alloy layer 208 may be approximately 20 angstroms to approximately 30 angstroms. In some embodiments, the cobalt or cobalt alloy layer or titanium or titanium alloy layer 208 may be deposited with a chemical vapor deposition (CVD) process, a metal-organic CVD (MOCVD) process or a physical vapor deposition (PVD) process using a cobalt or cobalt alloy or titanium or titanium alloy material.

At block 104, a pre-treatment may be optionally performed on the cobalt or cobalt alloy layer to clean the cobalt or cobalt alloy layer before deposition of an aluminum layer. In some environments, the cobalt or cobalt alloy layer may be exposed to oxygen which can form an oxide on the cobalt or cobalt alloy layer. The oxide and/or other contaminants are removed by the pre-treatment process. In some embodiments, the pre-treatment is a thermal hydrogen anneal process. In some embodiments, the pre-treatment is performed with hydrogen at a temperature of 400 degrees Celsius (C) for approximately 60 seconds. In some embodiments, the pre-treatment is performed with hydrogen for a time duration of approximately 60 seconds to approximately 120 seconds. In some embodiments, the pre-treatment is performed with hydrogen at a temperature of approximately 300 degrees C. to approximately 400 degrees C. The pre-treatment of the cobalt or cobalt alloy layer may allow the aluminum to be better deposited on the cobalt or cobalt alloy layer by removing any contaminants on the surface of the cobalt or cobalt alloy layer. In some embodiments, the deposition of the cobalt or cobalt alloy layer is performed in a first semiconductor process tool and then moved to a second semiconductor process tool for pre-treatment. The inventors have found that hydrogen provides better aluminum deposition results than ammonium and that the duration of the pre-treatment did not have a strong impact due to the thinness of the treated cobalt or cobalt alloy layer.

Figure 3:
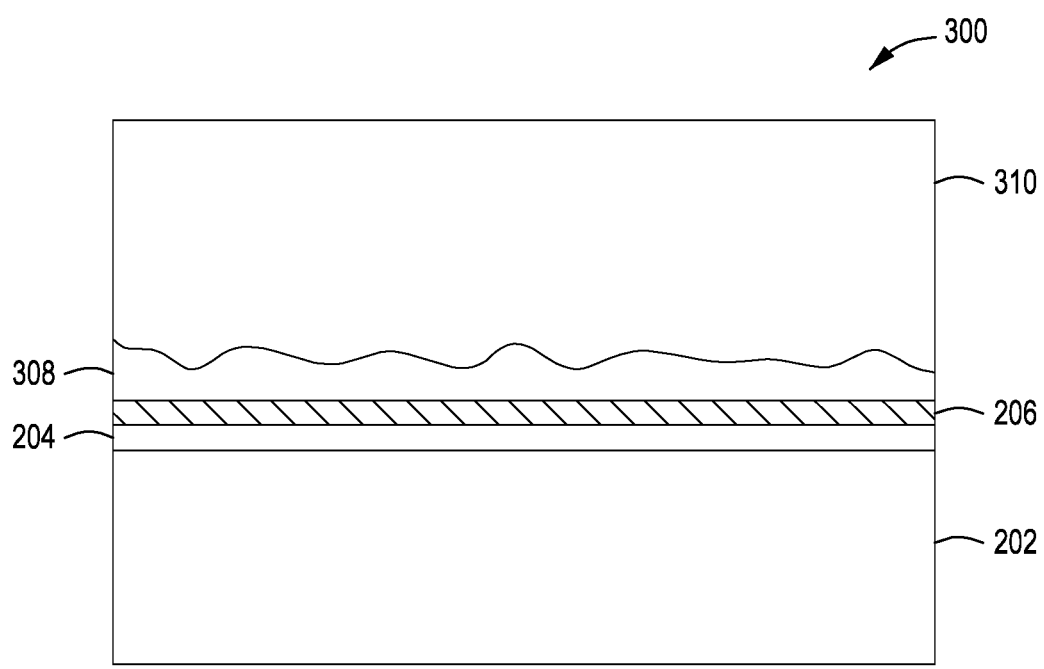
FIG. 3 depicts a cross-sectional view of a structure with an aluminum layer formed from the method of FIG. 1 in accordance with some embodiments of the present principles.

At block 106, an aluminum layer 310 is deposited on the cobalt or cobalt alloy layer or titanium or titanium alloy layer 208 as illustrated, for example, in FIGS. 2 and 3. In some embodiments, the aluminum layer 310 may be deposited in a third semiconductor process tool (e.g., MOCVD or CVD chamber) other than the first and second semiconductor process tools used for the cobalt or cobalt alloy layer or titanium or titanium alloy layer 208 and the pre-treatment, respectively. The aluminum layer 310 has an interface nucleation 308 with the cobalt or cobalt alloy layer or titanium or titanium alloy layer 208. The intermixing between the aluminum layer 310 and the cobalt or cobalt alloy layer or titanium or titanium alloy layer 208 helps the nucleation of the aluminum layer 310 which allows for better deposition of the aluminum layer 310. In some embodiments, deposition of the aluminum layer 310 may have an increased deposition rate of approximately 80% to approximately 95% over tungsten and TiN underlayers. The interface nucleation provides a higher film continuity that allows for thinner aluminum layers with high reflectivity. In some embodiments, the aluminum deposition temperatures may range from approximately 60 degrees C. to approximately 250 degrees C. The inventors have found that decreasing the temperature may help in increasing reflectivity of the deposited aluminum layer 310. In some embodiments, the aluminum deposition temperature may be approximately 120 degrees C. to yield a higher level of reflectivity (at least approximately 85%) for the aluminum deposition layer.

In some embodiments, the reflectivity of the aluminum layer 310 may be more than 50% to approximately 90% or greater. The inventors have found that the deposition precursor used, the thickness of the deposition, and the deposition temperature may affect the reflectivity of the aluminum layer. In some embodiments, the aluminum deposition precursor may be an alane type precursor such as, for example, trimethylamine-alane borane (TMAAB), methyl pyridine aluminum, or dimethylethylamine-alane (DMEAA). In some embodiments, the aluminum deposition precursor may be an alkyl type precursor such as, for example, dimethylaluminum hydride (DMAH). The DMAH may prove difficult to handle due to the DMAH having high viscosity. In some embodiments, the DMAH may have a small amount (approximately 0.1% to approximately 5%) of solvent or additive added to the DMAH to make it easier to handle. In some embodiments, the aluminum deposition process may use a reactant gas such as, for example, a hydrogen gas ($H_2$), an ammonia gas ($NH_3$), a hydrazine compound gas, or a mixed gas (e.g., $H_2+NH_3$, $H_2$+hydrazine compound gas, etc.).

In some embodiments, aluminum reflectivity of at least 85% may be obtained over wavelengths ranging from approximately 250 nm to approximately 900 nm. In some embodiments, the thickness of the aluminum layer may be approximately 300 angstroms to approximately 1,000 angstroms. A smaller thickness helps to make the aluminum layer more conformal, especially on high-aspect ratio features of a substrate. Tungsten and TiN underlayers require a thick layer of aluminum before the aluminum becomes continuous. The cobalt or cobalt alloy underlayer or titanium or titanium alloy underlayer allows a higher continuity with a thinner layer of aluminum, yielding thin, conformal aluminum layers with high reflectivity and a greater range of applications. The properties of the aluminum layer according to the methods and apparatus of the present principles makes the aluminum layer ideal for use on high-aspect ratio features and redistribution layers (RDL) where high-resolution conductive patterning is used over varying step-heights and also in applications where subsequent processing uses additional heating steps (e.g., back-end-of-line (BEOL) processes, etc.).

Figure 4:
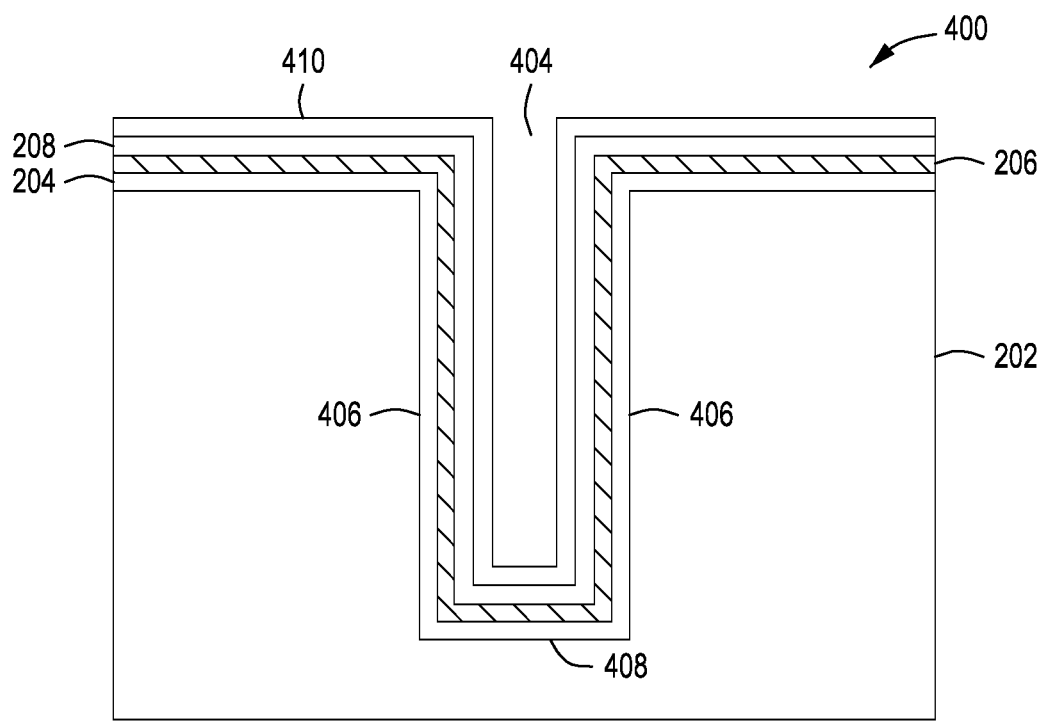
FIG. 4 depicts a cross-sectional view of a high-aspect ratio feature with an aluminum layer in accordance with some embodiments of the present principles.

FIG. 4 illustrates a cross-sectional view of a high-aspect ratio feature 400 with a conformal aluminum layer 410 in accordance with some embodiments. The high-aspect ratio feature 400 has an opening 404, sides 406, and a bottom 408. The substrate 202 is made of a silicon-based material that may have a silicon oxide layer 204 on a surface of the substrate 202. A cobalt or cobalt alloy layer or titanium or titanium alloy layer 208 is deposited on a TiN layer 206 which is deposited on the substrate 202. The conformal aluminum layer 410 is deposited on the cobalt or cobalt alloy layer or titanium or titanium alloy layer 208 such that the conformal aluminum layer 410 conforms to the high-aspect ratio feature 400 on the bottom 408 and sides 406 while maintaining high reflectivity, even in the high-aspect ratio feature 400. In some embodiments the conformal aluminum layer 410 may have a thickness of approximately 500 angstroms. The thinness afforded by the methods and apparatus of the present principles allows aluminum to be deposited in a conformal manner even when features have high-aspect ratios. The conformal characteristic of the methods and apparatus of the present principles also permits deposition of aluminum layers over varying step-heights such as those encountered during construction of redistribution layers (RDL).

Figure 5:
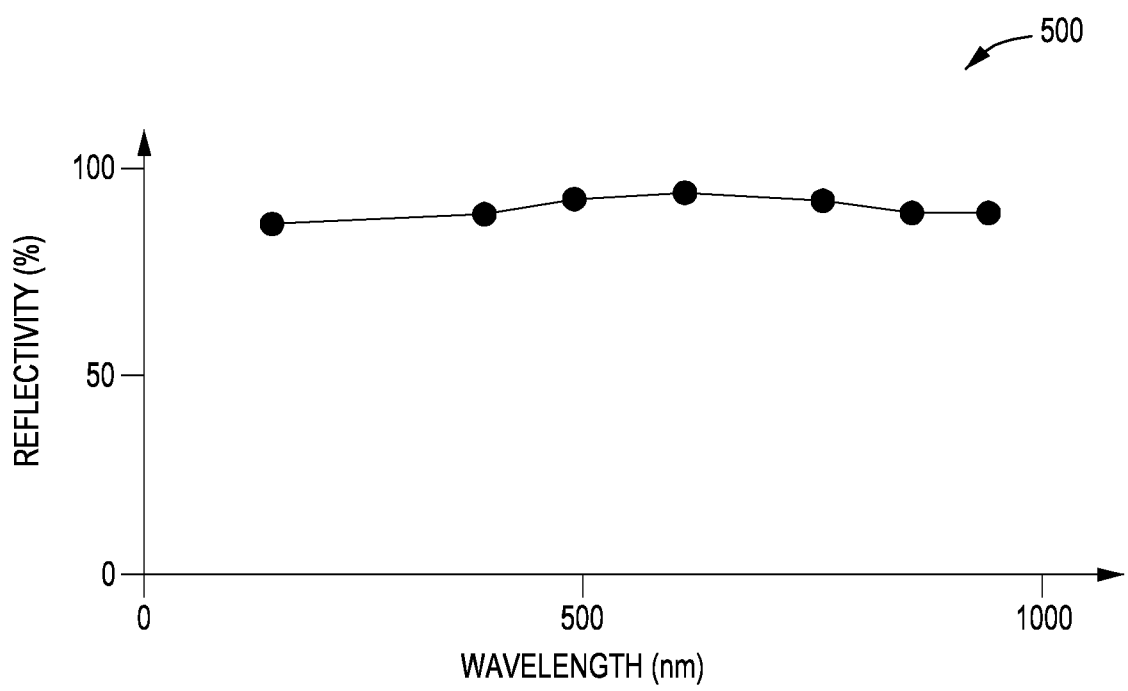
FIG. 5 depicts a graph of reflectivity of an aluminum layer over a range of wavelengths in accordance with some embodiments of the present principles.
Figure 6:
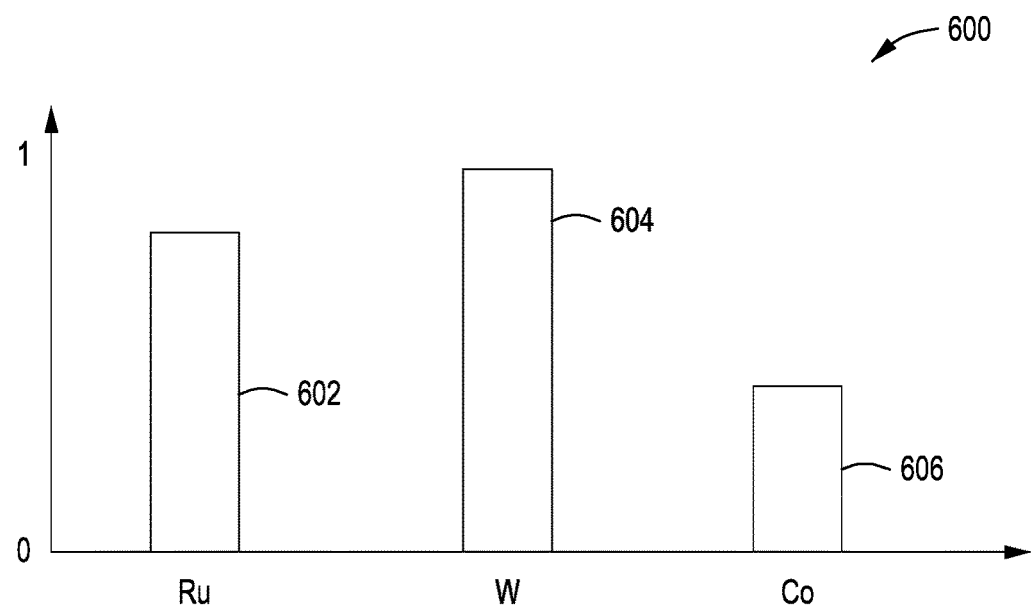
FIG. 6 depicts a graph of comparative grain size of an aluminum layer in accordance with some embodiments of the present principles.
Figure 7:
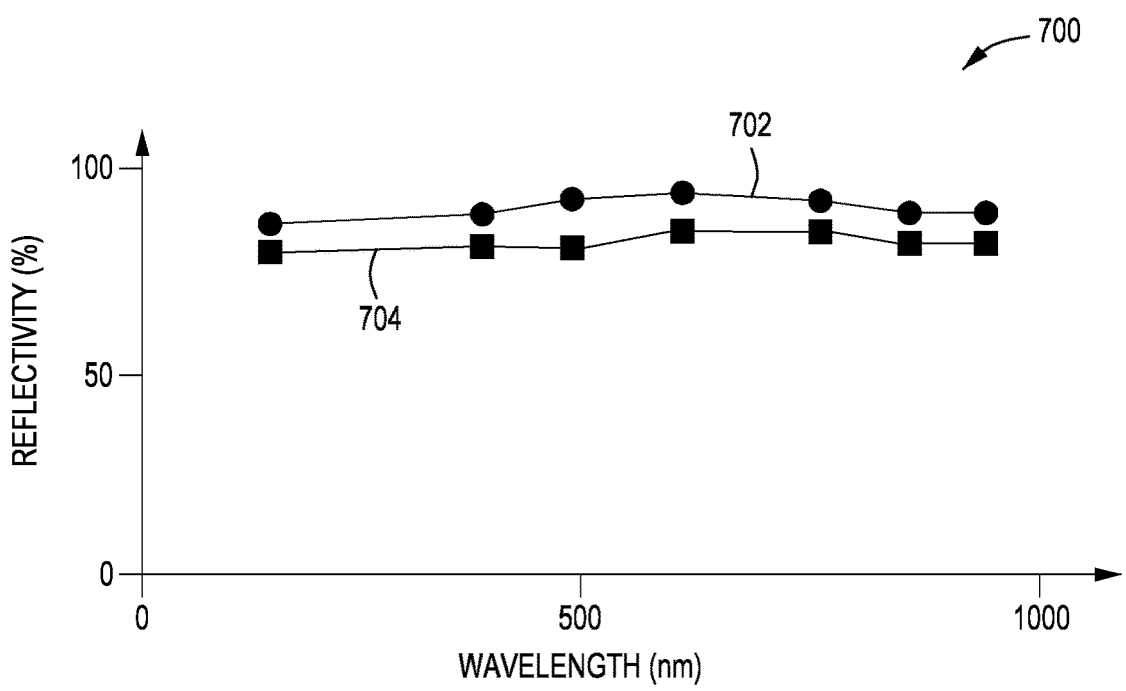
FIG. 7 depicts a graph of comparative reflectivity of an aluminum layer after undergoing an annealing process in accordance with some embodiments of the present principles.

FIG. 5 depicts a graph 500 of reflectivity of an aluminum layer over a range of wavelengths in accordance with some embodiments. The graph 500 illustrates the high level of reflectivity discovered by the inventors for a wide range of wavelengths using methods and apparatus of the present principles. In some embodiments, the wavelengths exhibited reflectivity on an aluminum layer of at least approximately 85%. FIG. 6 depicts a graph 600 of comparative grain size of an aluminum layer in accordance with some embodiments. The inventors found that cobalt (Co) 606 produced a much smaller aluminum grain size compared to tungsten (W) 604 or Ruthenium (Ru) 602. The smaller grain size of cobalt 606 is believed by the inventors to help in providing high film continuity for the aluminum layer with reduced thickness. FIG. 7 depicts a graph 700 of comparative reflectivity of an aluminum layer after undergoing an annealing process in accordance with some embodiments. The inventors subjected an aluminum layer with high reflectivity to an annealing process to illustrate the effect of subsequent semiconductor thermal processing steps on the reflectivity of the aluminum layer deposited according to the present principles. The after-anneal reflectivity 704 was within a negligible percentage of the pre-anneal reflectivity 702 over the band of wavelengths tested. Due to the advantageous robustness of the methods and apparatus of the present principles, subsequent semiconductor processes that use thermal heating will have little negative impact on the reflectivity.

While the foregoing is directed to embodiments of the present principles, other and further embodiments of the principles may be devised without departing from the basic scope thereof.

The invention claimed is:

1. A method of depositing an aluminum layer on a substrate, comprising:
   depositing a layer of cobalt or cobalt alloy or a layer of titanium or titanium alloy on a feature on the substrate;
   pre-treating the layer of cobalt or cobalt alloy or the layer of titanium or titanium alloy with a thermal hydrogen anneal before depositing a layer of aluminum;
   conformally depositing the layer of aluminum on the layer of cobalt or cobalt alloy or the layer of titanium or titanium alloy on the feature on the substrate at a temperature of approximately 60 degrees Celsius to approximately 250 degrees Celsius, wherein the layer of aluminum has a reflectivity of at least 85% for wavelengths between approximately 250 nm and approximately 900 nm and a thickness of approximately 300 angstroms to approximately 1,000 angstroms; and
   annealing the feature after conformally depositing the layer of aluminum, wherein the layer of aluminum maintains the reflectivity of at least 85% after annealing of the feature.

2. The method of claim 1, further comprising:
pre-treating the layer of cobalt or cobalt alloy at a temperature of approximately 300 degrees Celsius to approximately 400 degrees Celsius.

3. The method of claim 1, further comprising:
pre-treating the layer of cobalt or cobalt alloy for a duration of approximately 60 seconds to approximately 120 seconds.

4. The method of claim 1, further comprising:
depositing the layer of cobalt or cobalt alloy or the layer of titanium or titanium alloy to a thickness of approximately 20 angstroms to approximately 30 angstroms.

5. The method of claim 1, further comprising:
depositing the layer of cobalt or cobalt alloy or the layer of titanium or titanium alloy with a chemical vapor deposition (CVD) process, a metal-organic chemical vapor deposition (MOCVD) process or a physical vapor deposition (PVD) process.

6. The method of claim 1, wherein the layer of cobalt or cobalt alloy includes cobalt or cobalt silicon and wherein the layer of titanium or titanium alloy includes titanium, titanium silicon, or titanium aluminum.

7. The method of claim 1,
wherein the temperature during conformally depositing the layer of aluminum increases an interface nucleation when aluminum is deposited on the layer of cobalt or cobalt alloy or the layer of titanium or titanium alloy and increases smoothness, continuity, and reflectivity of the layer of aluminum.

8. The method of claim 1, further comprising:
depositing the layer of aluminum using a hydrogen gas, an ammonia gas, a hydrazine compound gas, a hydrogen and ammonia mixed gas, or a hydrogen and hydrazine compound gas as a reactant gas.

9. The method of claim 1, further comprising:
depositing the layer of aluminum using an alane precursor or an alkyl precursor.

10. The method of claim 9, wherein the alane precursor includes trimethylamine-alane borane (TMAAB), methyl pyridine aluminum, or dimethylethylamine-alane.

11. The method of claim 9, wherein the alkyl precursor includes dimethylaluminum hydride (DMAH).

12. The method of claim 1, further comprising:
depositing the layer of cobalt or cobalt alloy or the layer of titanium or titanium alloy on a layer of titanium nitride deposited on the substrate.

13. A method of depositing an aluminum layer on a substrate, comprising:
depositing a layer of cobalt or cobalt alloy or a layer of titanium or titanium alloy on a feature of an image sensor on the substrate with a chemical vapor deposition (CVD) process to a thickness of approximately 20 angstroms to approximately 30 angstroms; and
pre-treating the layer of cobalt or cobalt alloy or the layer of titanium or titanium alloy with a thermal hydrogen anneal at a temperature of approximately 400 degrees Celsius before depositing a layer of aluminum; and
conformally depositing the layer of aluminum on the layer of cobalt or cobalt alloy or the layer of titanium or titanium alloy on the feature on the substrate with a CVD process at a temperature of approximately 120 degrees Celsius and to a thickness of approximately 300 angstroms to approximately 1,000 angstroms, wherein the layer of aluminum has a reflectivity of at least 85% for wavelengths between approximately 250 nm and approximately 900 nm; and
annealing the feature after conformally depositing the layer of aluminum, wherein the layer of aluminum maintains the reflectivity of at least 85% after annealing of the feature.

14. The method of claim 13,
wherein the temperature during conformally depositing the layer of aluminum increases an interface nucleation when aluminum is deposited on the layer of cobalt or cobalt alloy or the layer of titanium or titanium alloy and increases smoothness, continuity, and reflectivity of the layer of aluminum.

15. The method of claim 13, further comprising:
depositing the layer of cobalt or cobalt alloy or the layer of titanium or titanium alloy on a layer of titanium nitride deposited on the substrate.

\* \* \* \* \*